(12) United States Patent
Nguyen et al.

(10) Patent No.: US 8,198,807 B2
(45) Date of Patent: Jun. 12, 2012

(54) HERMETICALLY-SEALED PACKAGES FOR ELECTRONIC COMPONENTS HAVING REDUCED UNUSED AREAS

(75) Inventors: Kelvin Nguyen, Rochester, NY (US); Michelle Nicole Haase Pastel, Horseheads, NY (US); Lu Zhang, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 876 days.

(21) Appl. No.: 12/072,792

(22) Filed: Feb. 28, 2008

(65) Prior Publication Data

US 2009/0218253 A1    Sep. 3, 2009

(51) Int. Cl.
*H01L 51/50* (2006.01)
(52) U.S. Cl. ........................................ 313/512
(58) Field of Classification Search .......... 313/498, 313/512
See application file for complete search history.

(56) References Cited

U.S. PATENT DOCUMENTS

| | | | |
|---|---|---|---|
| 6,910,953 B2 | 6/2005 | Allaire et al. | 451/44 |
| 6,998,776 B2 | 2/2006 | Aitken et al. | 313/512 |
| 2002/0187575 A1 | 12/2002 | Maruyama et al. | 438/33 |
| 2004/0191566 A1 | 9/2004 | Kikuchi et al. | 428/690 |
| 2005/0001545 A1 | 1/2005 | Aitken et al. | 313/512 |
| 2005/0151151 A1* | 7/2005 | Hawtof et al. | 257/100 |
| 2006/0082298 A1 | 4/2006 | Becken et al. | 313/512 |
| 2007/0128965 A1 | 6/2007 | Burt et al. | 445/25 |
| 2007/0128966 A1 | 6/2007 | Becken et al. | 445/25 |
| 2007/0128967 A1 | 6/2007 | Becken et al. | 445/25 |
| 2007/0205719 A1 | 9/2007 | Kim | 313/512 |
| 2007/0267972 A1 | 11/2007 | Menegus et al. | 313/512 |
| 2009/0039760 A1 | 2/2009 | Kwon et al. | 313/498 |
| 2009/0069164 A1 | 3/2009 | Lamberson et al. | 501/15 |

FOREIGN PATENT DOCUMENTS

| | | |
|---|---|---|
| JP | 2002-280169 | 9/2002 |
| JP | 2007-035322 | 2/2007 |
| WO | 2007/059223 | 5/2007 |
| WO | WO2007/067384 | 6/2007 |

\* cited by examiner

*Primary Examiner* — Toan Ton
*Assistant Examiner* — Hana Featherly
(74) *Attorney, Agent, or Firm* — Kevin M. Able (57) ABSTRACT

Hermetically-sealed packages for electronic components, e.g., OLEDs, are provided. The packages have a first glass substrate (12), a second glass substrate (16), and a wall (14) that separates the first and second substrates (12,16) and hermetically seals the electronic component (18) between the substrates (12,16). The package has a reduced outer unused area characterized by distances $D_{first}$ (32a) and $D_{second}$ (32b) at least one of which, and, in certain embodiments, both of which are less than 200 microns, e.g., one or both of $D_{first}$ (32a) and $D_{second}$ (32b) is approximately 100 microns. The reduction in unused area can be used to increase viewing area, improve electrical lead design, and/or increase package strength through the use of a wider sintered frit wall (14).

11 Claims, 7 Drawing Sheets

HERMETICALLY-SEALED PACKAGES FOR ELECTRONIC COMPONENTS HAVING REDUCED UNUSED AREAS

I. FIELD OF THE INVENTION

This invention relates to hermetically-sealed packages for electronic components, such as the organic light emitting diodes (OLEDs) used in displays. More particularly, the invention relates to hermetically-sealed packages having reduced unused areas and to methods for producing such packages.

II. BACKGROUND OF THE INVENTION

OLED-based displays are currently being considered for use in many applications which presently employ liquid crystal displays (LCDs). OLED-based displays can provide brighter and clearer images than liquid crystal displays and also need less power. However, the organic molecules used in OLEDs are strongly reactive with oxygen and moisture, and thus susceptible to damage from exposure to air. Such exposure may lead to a reduction in the useful life of the light emitting device. Therefore, hermetic sealing is one of basic requirements for long term performance of OLEDs.

Efforts have been made to hermetically seal OLED-based displays with organic materials, such as epoxy resins. An alternate technology with substantially better performance has been developed by Corning Incorporated, the assignee of this application. In accordance with this approach, a frit-containing paste is made by mixing glass particles, filler particles, e.g., crystalline particles, and a vehicle, e.g., a vehicle comprising one or more solvents and one or more binders and/or dispersing aids. The paste is dispensed on a first substrate (e.g., a first glass sheet) and is sintered using, for example, a high temperature furnace to produce a sintered frit pattern.

The resulting assembly, known as a fritted cover glass or simply a cover, is combined with a second substrate (e.g., a second glass sheet) carrying one or more OLED devices. The cover and the second substrate are sealed together by exposing the sintered frit pattern to laser energy. In particular, a laser beam is scanned (traversed) over the sintered frit pattern to locally raise the temperature of the sintered frit above its softening point. In this way, the sintered frit adheres to the second substrate and forms a strong seal between the cover and the second substrate. Since the sintered frit is a glass and ceramic material, as opposed to an organic material, the penetration of oxygen and moisture through the frit seal is much slower than through the epoxy seals previously used to encapsulate OLED devices.

The sintered frit sealing technique, however, does have the disadvantage that it uses a high power laser to melt the sintered frit. The resulting thermal cycle can cause thermal damage to OLED devices, a problem which does not usually arise with epoxy sealing employing ultraviolet (UV) curing. Also, in the laser frit sealing technique, the sintered frit needs to be bonded to various device materials such as metal leads, indium tin oxide (ITO), protective materials, and the like. In addition, each material on the device side of the sintered frit has a different set of thermal properties (e.g., coefficient of thermal expansion (CTE), heat capacity and thermal conductivity). These different materials and different sets of thermal properties can cause a significant variation in required buffer space to achieve a strong bond of the sintered frit without creating thermal damage to the OLED.

To minimize these problems, an OLED-based display typically includes a substantial border, e.g., a border having a width of 600-1500 microns, between the OLED device(s) and the inner edge of the sintered frit (referred to herein as the "inner unused area"). For small displays, such as those used in cell phones, PDAs and other mobile electronic devices, this inner unused area represents a substantial fraction of the total area available for image generation.

A further limitation on useable space arises from the manner in which OLED-containing glass packages are processed after laser sealing has been completed. Specifically, when the sealing step is finished, the device is typically scored and broken to a desired dimension (the resulting package is referred to herein as a "sized package"). In practice, it has been found that if the score line is too close to the edges of the sintered frit, the frit will be exposed to a high level of stress during the scoring and breaking process which will weaken the bond strength significantly and/or cause delamination. It is also difficult to achieve glass edges free of defects without damaging the sintered frit after scoring if the score line is too close to the sintered frit edge.

For these reasons, as well as to accommodate the tolerances of commercial scoring machines, a minimum distance in the range of 300 to 600 microns from the score line to the sintered frit edge has been maintained on three sides of sized OLED-based displays, the specific distance depending on the particular equipment being used and display being produced. (The fourth side is used to make electrical connections to the OLEDs and is normally left larger than the other three sides). This three-sided outer border is referred to herein as the "outer unused area" and, along with the inner unused area discussed above, represents a substantial fraction of the sized packages of small displays, e.g., displays having a viewing area in the range of 1.5 to 20 square centimeters.

Small displays also present challenges with regard to strength since, as is well known, such displays are often dropped, sat on, bumped, and otherwise abused in the field. Compared to an epoxy resin, sintered frits, being glass/ceramic materials, are less flexible. It would thus be desirable to increase the basic strength of the sintered frit seal to minimize its chances of failure in the field. In particular, it would be desirable to increase the width of the sintered frit in order to provide a larger bonded area and thus greater overall mechanical strength. However, given the limited areas available as a result of the inner and outer unused areas, dedicating more space to the sintered frit wall has been resisted by OLED display manufacturers.

In view of the foregoing, there exists a need in the art for electronic packages, such as OLED-based display packages, which have reduced unused areas. The present invention addresses this need.

III. SUMMARY OF THE INVENTION

In accordance with one aspect, the invention provides a package comprising a first glass substrate (12), a second glass substrate (16), a wall (14) that comprises a sintered glass frit and separates the first and second substrates, and at least one electronic component (e.g., OLED 18) that is hermetically sealed between the first and second substrates (12, 16) by the wall (14), wherein:

(a) the package has first and second sides (30a, 30b);

(b) the wall has first and second sides (14a, 14b) which are substantially parallel to the first and second sides (30a, 30b) of the package, respectively;

(c) the first side of the package (30a) and the first side of the wall (14a) are separated by a distance $D_{first}$ (32a);

(d) the second side of the package (30*b*) and the second side of the wall (14*b*) are separated by a distance $D_{second}$ (32*b*); and (e) at least one of $D_{first}$ and $D_{second}$ is less than or equal to 200 microns.

In certain embodiments, both $D_{first}$ and $D_{second}$ are less than or equal to 200 microns. In other embodiments, at least one of $D_{first}$ and $D_{second}$ is approximately equal to 100 microns. In still further embodiments, both $D_{first}$ and $D_{second}$ are approximately equal to 100 microns.

In accordance with another aspect, at least one of the first or second sides (30*a*, 30*b*) is formed by grinding a scored and broken glass edge. In an embodiment of this aspect of the invention, the grinding is performed while flooding the edge with a cooling medium. In another embodiment, a space (19) between the first and second glass substrates (12, 16) and the wall (14) is filled with a resin prior to the grinding.

The reference numbers used in the above summaries of the various aspects of the invention are only for the convenience of the reader and are not intended to and should not be interpreted as limiting the scope of the invention. More generally, it is to be understood that both the foregoing general description and the following detailed description are merely exemplary of the invention and are intended to provide an overview or framework for understanding the nature and character of the invention.

Additional features and advantages of the invention are set forth in the detailed description which follows, and in part will be readily apparent to those skilled in the art from that description or recognized by practicing the invention as described herein. The accompanying drawings are included to provide a further understanding of the invention, and are incorporated in and constitute a part of this specification. It is to be understood that the various features of the invention disclosed in this specification and in the drawings can be used in any and all combinations.

IV. BRIEF DESCRIPTION OF THE DRAWINGS

FIGS. 7A, 7B, and 7C compare a conventional package (FIG. 7A) with two embodiments of the present invention (FIGS. 7B and 7C).

V. DETAILED DESCRIPTION OF THE INVENTION AND ITS PREFERRED EMBODIMENTS

As discussed above, the present invention relates to the packaging of electronic components, e.g., temperature sensitive elements such as OLEDs, wherein the sealed and sized package has: (1) a high level of hermeticity and (2) a reduced unused area, specifically, a reduced outer unused area.

Figure 1:
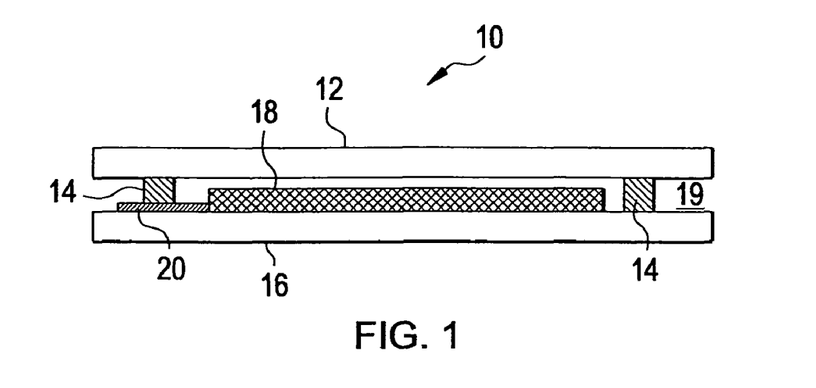
FIG. 1 is a schematic, cross sectional, side view of a display device employing an OLED.

FIG. 1 is a schematic, cross-sectional, side view of a hermetically sealed OLED display device, generally designated by reference numeral 10, comprising a first substrate 12, a sintered frit pattern 14, a second substrate 16, at least one OLED element 18, and at least one electrode 20 in electrical contact with the OLED element. Typically, OLED element 18 is in electrical contact with an anode electrode and a cathode electrode. Electrode 20 in FIG. 1 is intended to represent either electrode. Although only a single OLED element is shown for simplicity, display device 10 may have many OLED elements disposed therein. The typical OLED element 18 includes one or more organic layers (not shown) and anode/cathode electrodes. However, it should be readily appreciated by those skilled in the art that any known OLED element 18 or future OLED element 18 can be used in display device 10. In addition, it should be appreciated that another type of thin film device can be housed in the packages of the invention besides OLED element 18. For example, thin film sensors, photovoltaic cells, and the like may be fabricated using the present invention.

In one embodiment, first substrate 12 is a transparent, thin glass sheet produced using the fusion process, e.g., Corning Incorporated's Code 1737, EAGLE$^{2000}$®, EAGLE XG™, 0211 Microsheet glasses, or the fusion glasses produced by Nippon Electric Glass Co., NHTechno, and Samsung Corning Precision Glass Co. Alternatively, first substrate 12 can be produced by other processes, e.g., the float process used by Asahi Glass Co. to produce OA10 glass and OA21 glass, or soda lime glasses. Second substrate 16 may be made of the same glass as first substrate 12 or it may be a non-transparent substrate.

Figure 2:
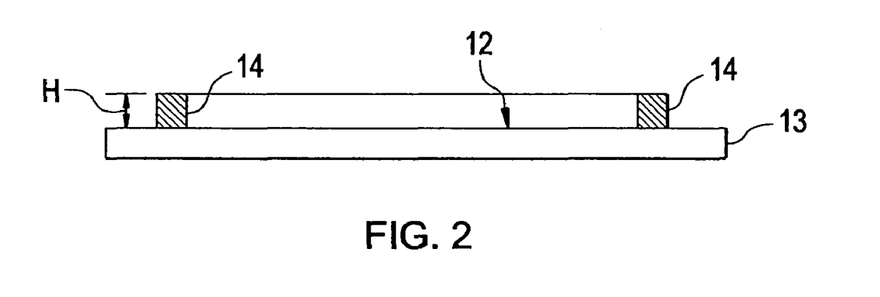
FIG. 2 is a cross sectional side view of a glass sheet with a sintered frit pattern bonded thereto.
Figure 3:
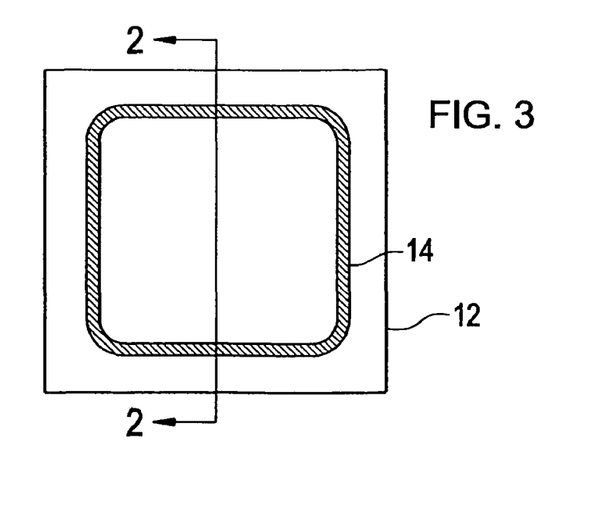
FIG. 3 is a top view of the glass sheet of FIG. 2 showing the sintered frit pattern as having the shape of a frame.

Prior to sealing first substrate 12 to second substrate 16, a frit-containing paste is deposited on a major surface of first substrate 12 in a predetermined pattern, which is typically placed approximately 1 mm away from the free edges 13 of first substrate 12 as a line, or a plurality of connected lines, and is typically deposited in the shape of a closed frame or wall. As used herein, the word "wall" is used in the sense of a barrier between the inside of the package and the outside atmosphere.

Preferably, after being deposited on first substrate 12, the frit-containing paste is sintered prior to being sealed to second substrate 16. To accomplish this, the deposited paste can, for example, be heated so that it becomes attached to first substrate 12, and then the substrate/heated paste combination can be placed in a furnace which sinters the paste (also referred to in the art as "firing" or "consolidating" the paste) to form the desired assembly of sintered frit pattern 14 bonded to first substrate 12. Alternatively, the initial heating step can be omitted, with the substrate/paste pattern combination being directly placed into a furnace for sintering. As a still further alternative, the sintering can be performed by heating just the paste pattern and the surrounding substrate, rather than the entire glass sheet. This localized heating can be performed on the entire paste pattern simultaneously or on sequential portions. In general, the furnace approach with an initial heating step is preferred since during the initial heating, organic components of the vehicle, e.g., organic binder materials, are burned out. The sintering temperature and time will, of course, depend on the composition of the paste, specifically, the composition of the paste's glass particles.

After sintered frit pattern 14 is formed, it can be ground, if necessary and desired, so that the height variation along the frit line does not exceed about 2-4 microns, with a typical target height H being 10 microns to greater than 20 microns, depending on the application for device 10; however, more typically height H is about 14-16 microns. If the height variation is larger, a gap, which may be formed between the sintered frit pattern and second substrate 16 when glass sheet 12 and substrate 16 are joined, may not close when the sintered frit pattern 14 melts during laser sealing (see below), or the gap may introduce stresses which can crack one or both of the substrates, particularly during cooling. An adequate but not overly thick frit height H allows the laser sealing to be performed from the backside of first substrate 12. If sintered frit pattern 14 is too thin, it does not leave enough material to absorb the laser radiation, resulting in failure. If the pattern is too thick, it will be able to absorb enough energy at the surface of the first substrate to melt, but will prevent the necessary energy needed to melt the sintered frit from reaching the region of the frit proximate substrate 16. This usually results in poor or spotty bonding of the first and second substrates.

If the sintered frit pattern 14 is ground, the assembly of first substrate 12 and its attached sintered frit pattern 14 may go through a mild ultrasonic cleaning environment to remove any debris that may have accumulated. During cleaning, the temperature can be kept low to avoid degradation of the sintered frit pattern 14. After cleaning (if performed), a final processing step can be performed to remove residual moisture. For example, the assembly can be placed in a vacuum oven at a temperature of 100° C. for 6 or more hours, or dried in an oven with flowing, dry nitrogen at 300° C. for 6 or more hours. After removal from the oven, the assembly can be placed in a clean room box to deter accumulation of dust and debris. In addition, prior to use, the assembly of the first substrate 12 and sintered frit pattern 14 is preferably stored in an inert atmosphere to prevent re-adsorption of $O_2$ and $H_2O$ before melting.

The sealing process includes placing the assembly of first substrate 12 and sintered frit pattern 14 on top of substrate 16, with one or more OLEDs 18 and one or more electrodes 20 deposited on the substrate 16, in such a manner that the sintered frit pattern, the one or more OLEDs, and the electrodes are sandwiched between the first and second substrates 12 and 16 separated by the thickness of the frit pattern. Mild pressure can be applied to the first and second substrates 16 to keep them in contact during the sealing process.

A laser beam is then directed onto frit pattern 14 through first substrate 12. Alternatively, if substrate 16 is transparent at the sealing wavelength, sealing may be performed through substrate 16, or through both substrates. In each case, the beam or beams are traversed over the sintered frit pattern to locally heat the pattern such that the glass component of the sintered frit melts and forms a hermetic seal which connects and bonds substrate 12 to substrate 16. The gap between substrates 12 and 16 resulting from the presence of the sintered frit seal 14 forms a hermetic envelope or package for OLED element 18. In particular, the package comprises the two substrates which form the faces of the package and the sintered frit 14 which forms the wall of the package. The hermetic seal of the package protects OLED(s) 18 by preventing oxygen and moisture in the ambient environment from entering into OLED display 10.

The laser beam or beams used during bonding can be defocused, for example, to make the temperature gradient within the sintered frit pattern more gradual. It should be noted that if the gradient is too steep (focus is too tight), OLED display 10 may exhibit cracking and subsequent failure. The sintered frit pattern generally needs a warm up and cool down phase during melting.

Further details regarding the formation of hermetically-sealed packages by traversing a laser beam over a sintered frit pattern can be found in commonly-assigned U.S. Patent Application Publications Nos. 2006/0082298, 2007/0128965, 2007/0128966, and 2007/0128967, the contents of which in their entireties are incorporated herein by reference.

Similarly, suitable compositions for the sintered glass frit which forms the wall of the package can be found in commonly-assigned U.S. Patent Application Publication No. 2005/0001545, entitled "Glass Package that is Hermetically Sealed with a Frit and Method of Fabrication," which is a continuation-in-part of U.S. Pat. No. 6,998,776, the contents of both of which in their entirety are incorporated herein by reference. A suitable glass for the glass component of the sintered frit comprises: 22.92 mole % $Sb_2O_3$, 46.10 mole % $V_2O_5$, 0.97 mole % $TiO_2$, 0.97 mole % $Al_2O_3$, 2.61 mole % $Fe_2O_3$, and 26.43 mole $P_2O_5$; a suitable ceramic for the filler particles of the sintered frit comprises: 50 mole % $SiO_2$, 25 mole % $Al_2O_3$, and 25 mole % $Li_2O$. Other sintered glass frits, now known or subsequently developed, can, of course, be used in the practice of the invention.

As discussed above, once the sealing step is finished, the package is scored and broken to a desired size. The scoring and breaking is performed using conventional glass processing equipment for creating a score line and then separating the glass outside of the score line from the main body of the glass by, for example, rotation of the two parts about the score line. Because of the problems with delamination and/or weakening of the sintered frit wall, the score and break process is conducted so as to leave a minimum distance of in the range of 300 to 600 microns, depending upon the application, between the score line and the outer edge of the sintered frit wall. In practice, it has been found that the yield of acceptable packages is highly dependent on the spacing of the score line from the sintered frit wall, e.g., a yield of acceptable sized packages of about 80% has been found to drop rapidly to as low as 15% as the spacing is reduced. Moreover, as the width of the sintered frit wall is reduced, the reduction in yield becomes even greater as the spacing is reduced.

Figure 4:
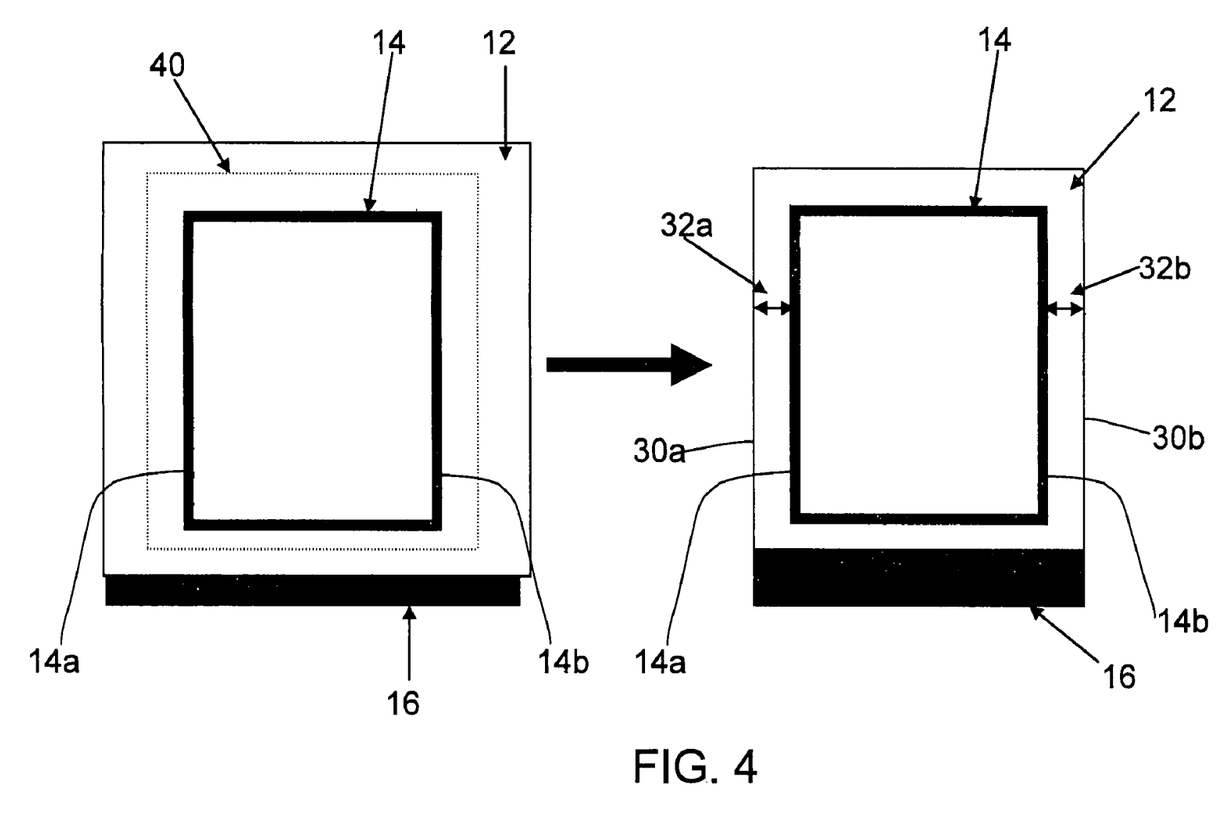
FIG. 4 is a schematic drawing illustrating a conventional method for processing an OLED-based display device after laser sealing.

The conventional score and break process is illustrated schematically in FIG. 4, where 40 represents the location of the conventional score line, 14a and 14b represent, respectively, first and second sides, e.g., the long sides, of sintered frit wall 14, 30a and 30b represent, respectively, first and second sides, e.g., the long sides, of the sealed and sized package 30, and 32a (32b) represents the distance $D_{first}$ ($D_{second}$) between the first (second) side of the sintered frit wall and the first (second) side of the sealed and sized package. Note that $D_{first}$ ($D_{second}$) is measured from the outer edge of the first (second) side of the sintered frit wall.

For the conventional process, the values of $D_{first}$ and $D_{second}$ are both in the range of 300 to 600 microns or more. This space is outboard of both the viewing area and the frit sealing area, and thus performs neither a display nor a mechanical strength function in the assembled package. It is thus completely unused (wasted) space.

Figure 5A:
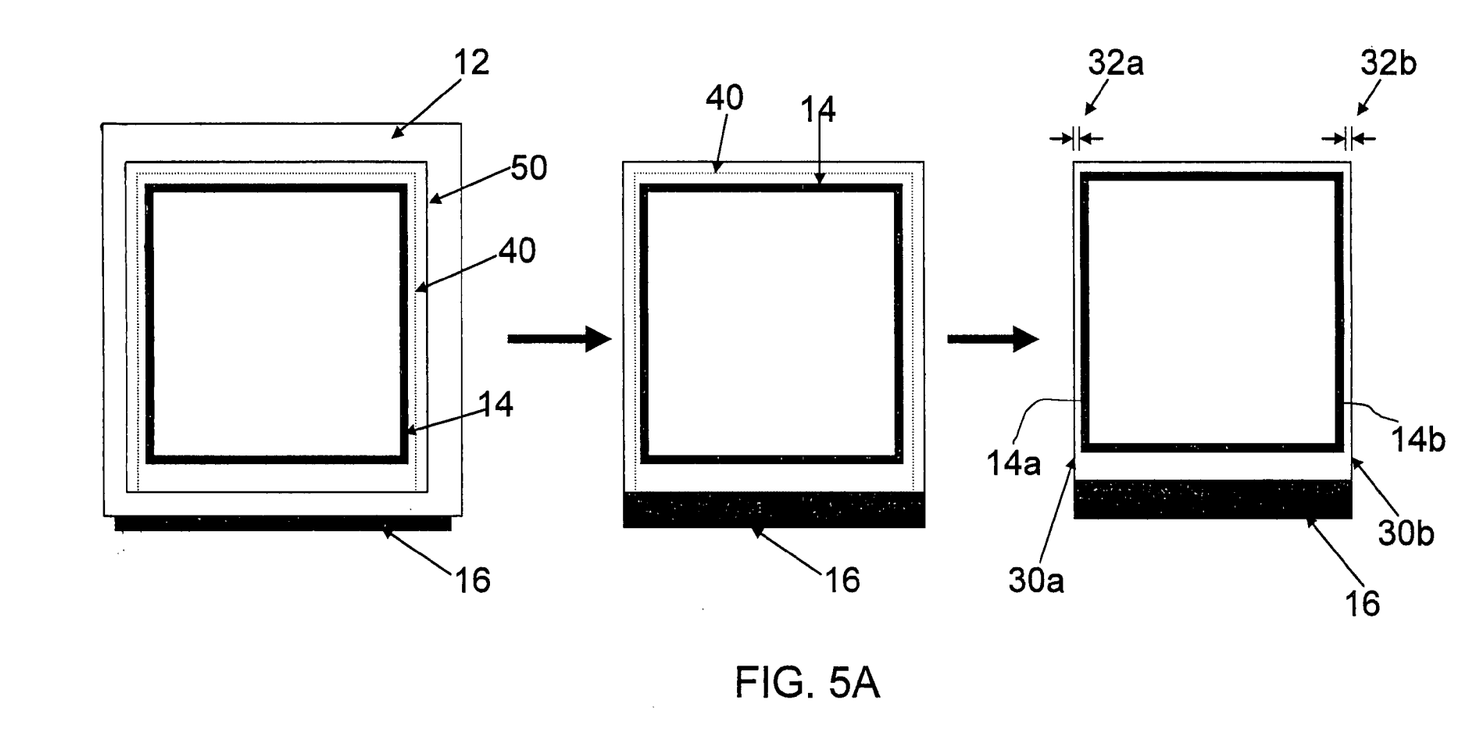
FIG. 5A is a schematic drawing illustrating an embodiment of the invention which produces a larger view area.
Figure 5B:
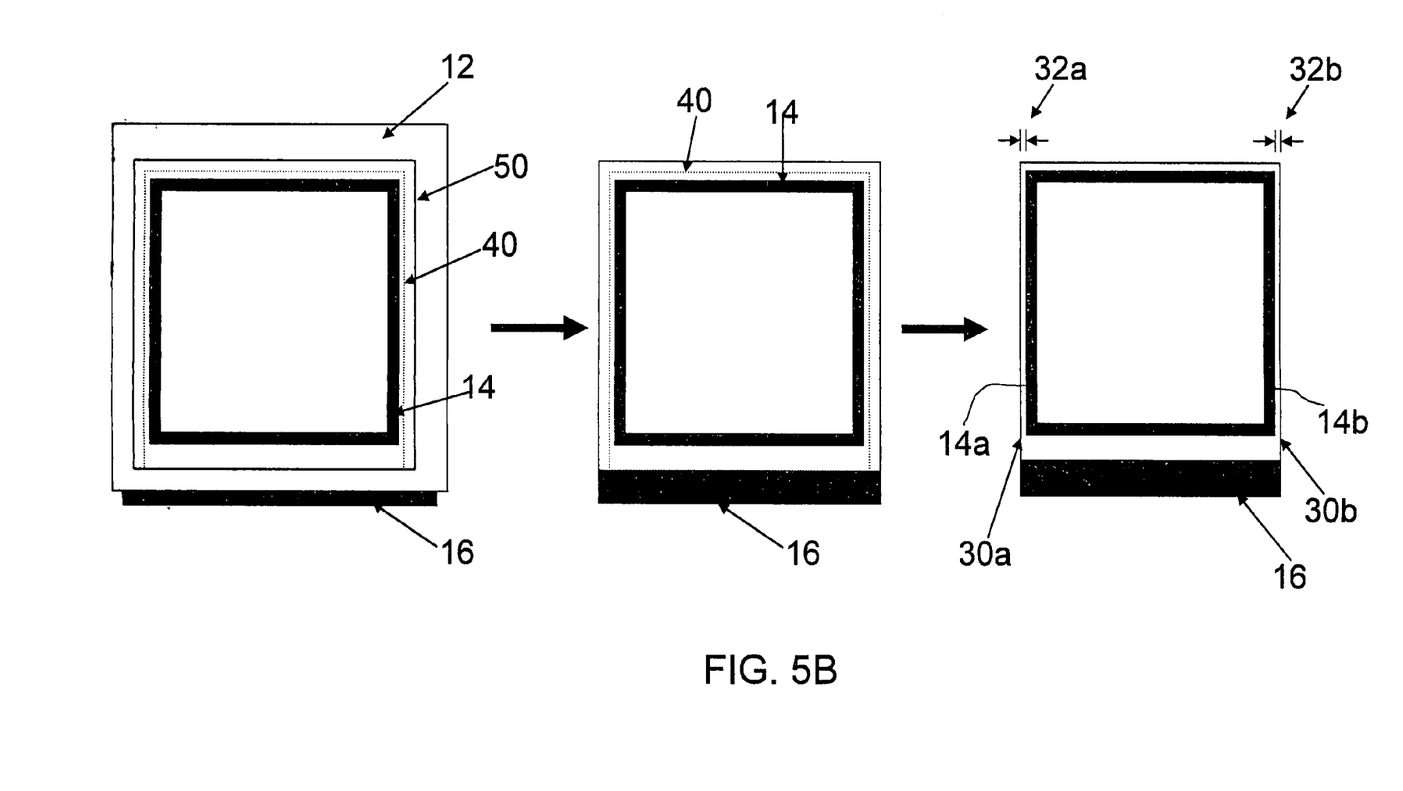
FIG. 5B is a schematic drawing illustrating an embodiment of the invention which produces a wider sintered frit wall.

FIGS. 5A and 5B illustrate embodiments of the invention wherein the outer unused area of FIG. 4 is substantially reduced, e.g., by at least approximately 50%, and employed to produce either a larger viewing area (FIG. 5A) or greater mechanical strength (FIG. 5B). The large arrows in these figures represent process steps, with the left panels showing the preparation of the sealed package, the middle panels showing the breaking and scoring of the panels, and the right panels showing the reduction in the outer unused area by grinding (see below).

More specifically, in FIG. 5A, sintered wall 14 has been moved closer to line 40, which, as discussed above, represents the location of the conventional score line. In this way, the viewing area inboard of the sintered wall is increased. It should be noted that instead of increasing the viewing area, if desired, the reduction in the unused area can be used to provide greater freedom in electrical lead design. In FIG. 5B, the viewing area is substantially the same as that of the conventional package, but the sintered frit wall has been made wider so that its outer edge is now closer to line 40. The wider frit wall substantially increases the mechanical strength of the package.

Figure 6A:
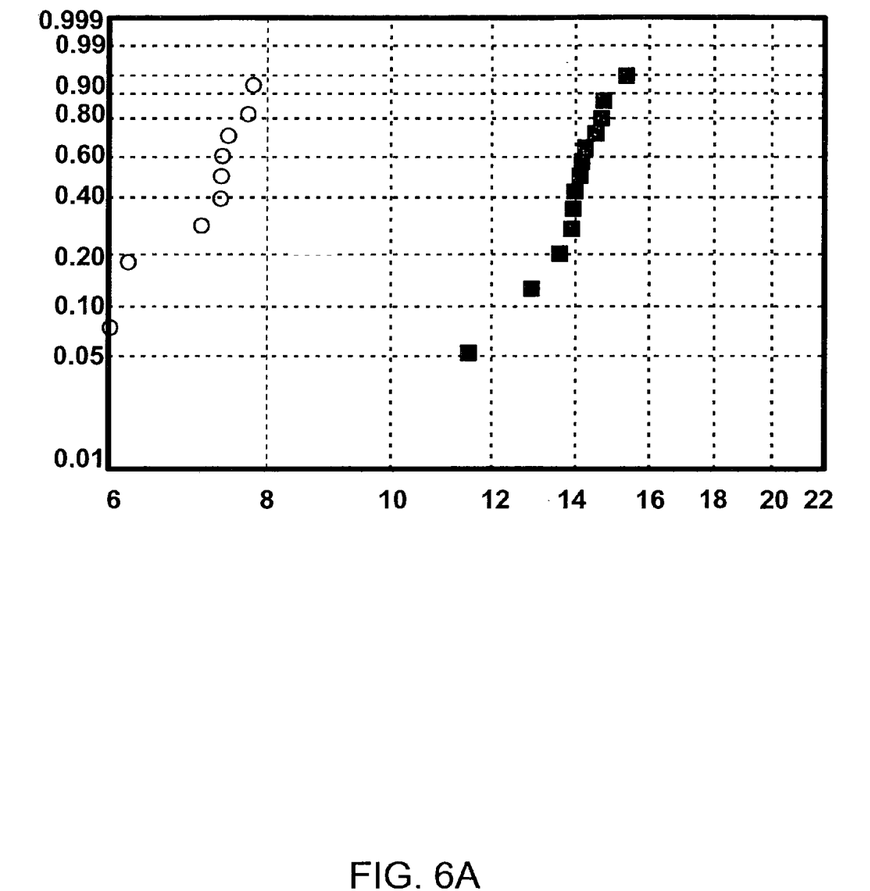
FIG. 6A is a graph comparing anticlastic strength of sealed devices having sintered frit widths of 0.4 mm (open circle data points) and 0.7 mm (filled square data points). The vertical axis in FIG. 6A is probability and the horizontal axis is anticlastic strength in pounds force to failure (lbf).
Figure 6B:
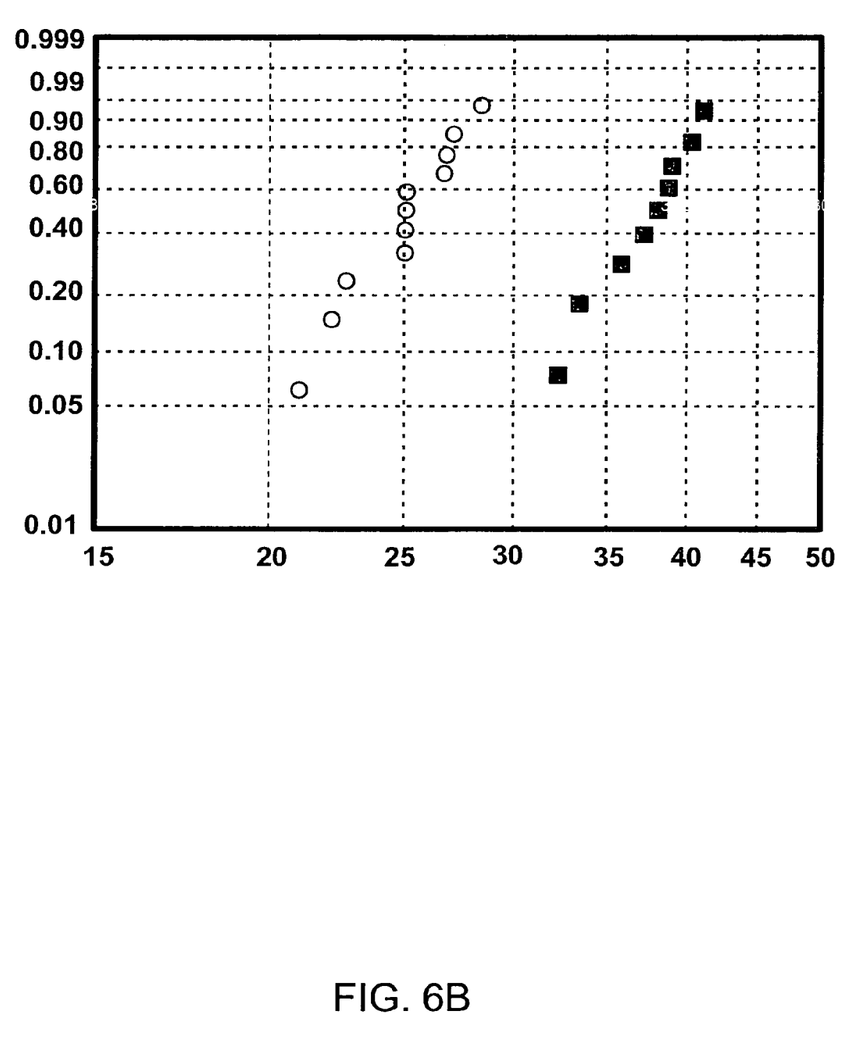
FIG. 6B is a graph comparing 4-point bend strength of sealed devices having sintered frit widths of 0.4 mm (open circular data points) and 0.7 mm (filled square data points). The vertical axis in FIG. 6A is probability and the horizontal axis is 4-point bend strength in pounds force to failure (lbf).

For example, FIGS. 6A and 6B are graphs comparing anticlastic strength (FIG. 6A) and 4-point bending strength (FIG. 6B) of packages, e.g., OLED packages, prepared with sintered frit walls whose widths were 0.4 mm (open data points) or 0.7 mm (filled data points). The vertical axes in FIGS. 6A and 6B are probability and the horizontal axes show the measured strengths in pounds force to failure (lbf).

As these graphs demonstrate, the ability to increase the width of the sintered frit wall without compromising viewing area is an important advantage of certain embodiments of the invention since it allows significant increases in mechanical strength (e.g., in FIG. 6A, the 0.4 mm sintered frit wall had a Weibull slope of 11.3 and a characteristic load of 7.5 lbf, while the 0.7 mm wall had a Weibull slope of 15.2 and a characteristic load of 14.4 lbf; in FIG. 6B, the Weibull slope and characteristic loads for the 0.4 mm wall were 11.9 and 26.1 lbf, respectively, while for the 0.7 mm wall, they were 13.3 and 38.8 lbf). As can be seen from this data, the strength of a sealed package employing a sintered frit wall increases proportionally with the width of the wall.

Returning to FIGS. 5A and 5B, in addition to showing the conventional score line (see reference number 40), these figures also show a score line 50 which is displaced outward from the conventional score line. In particular, in an embodiment of the invention, score line 50 is located in the range of 300-600 microns from the outer edge of sintered frit wall 14. In this way, scoring and breaking can be performed without damage to the sintered frit wall. Once the scoring and breaking has been completed, the size of the outer unused area is reduced by trimming the 300-600 microns down to at most 200 microns and in certain embodiments to as small as about 100 microns.

The trimming can be performed on one of the longer sides of the packages, on both longer sides, or on both longer sides and one of the shorter sides. Although the fourth side can also be trimmed, if desired, this side is used for electrical connections (see above) and thus will in general not require trimming. In terms of the variables $D_{first}$ and $D_{second}$, in accordance with the invention, at least $D_{first} \leq 200$ microns, and preferably, $D_{first} \leq 200$ and $D_{second} \leq 200$. In certain embodiments, $D_{first} \approx 100$ microns, and in other embodiments, $D_{first} \approx 100$ microns and $D_{second} \approx 100$ microns.

In view of the low yields associated with scoring and breaking at locations close to the sintered frit wall, it was surprising that trimming could be performed without destroying the sintered wall or its seal. Yet, it was found that grinding in combination with cooling through the use of a cooling medium, e.g., water, can be used to reduce the unused area to below 200 microns and even to as small as approximately 100 microns without compromising the sintered frit wall. Unexpectedly, the mechanical vibration and heat applied to the sintered frit wall during the grinding process did not cause the wall to fail.

In particular, the following experiment showed that a substantial fraction of the outer unused area can be removed while still leaving a mechanically sound, hermetically-sealed package. A frit paste was dispensed, pre-sintered, sealed, and scored and broken using conventional procedures. The distance from the glass edge to the outer edge of the sintered frit wall was 300 microns. The sealed package was then placed under the grinding wheel of a commercial, water cooled, grinding machine, specifically, a Chevalier Surface Grinder machine (model SMARTTH818), with one of the package's edges facing the grinding wheel. The machine was set to move in 2.5 micron steps with the wheel (500 grit) going back and forth on the side of the package that was being ground. The experiment was stopped once the grinding had reduced the distance between the edge of the package and the sintered frit wall to about 120 microns, i.e., once the outer unused area had been reduced by about 180 microns or 60%. The seal provided by the wall was still intact and delamination was not observed.

Microscopic examination of the ground edge revealed that it was smooth and composed of shallow scallops. The smoothness of the ground edge has the added benefit of increasing 4-point bend strength of the sealed package. In particular, it has been demonstrated that a reduction in cut edge defects can double 4-point bend strength. Since in addition to reducing the outer unused area, grinding also removes raw break edge defects, such as lateral cracks, it has the added benefit of increasing the mechanical strength of the sealed device even if the reduction in unused area is not employed to increase the width of the sintered frit wall. As discussed above, increases in strength are important for mobile applications because of the rough treatment such devices are subjected to in the field.

Although not used in the foregoing experiment, if desired, a resin, e.g., an epoxy or silicone resin, can be applied to some or all of the outer edges of the package before grinding to fill the space which lies outboard of the sintered frit wall 14 between substrates 12 and 16 (see reference number 19 in FIG. 1). Such a resin can reduce the amount of vibration transferred to the sintered frit wall during grinding and thus further reduce the chances of damage to the wall. As another optional step, the sealed package can be subjected to a cleaning procedure after the grinding has been completed to remove any debris which may have become attached to the package. In this regard, it should be noted that the grinding does not require any special ambient conditions and, in particular, can be, and normally will be, performed outside of a clean room.

Figure 7A:
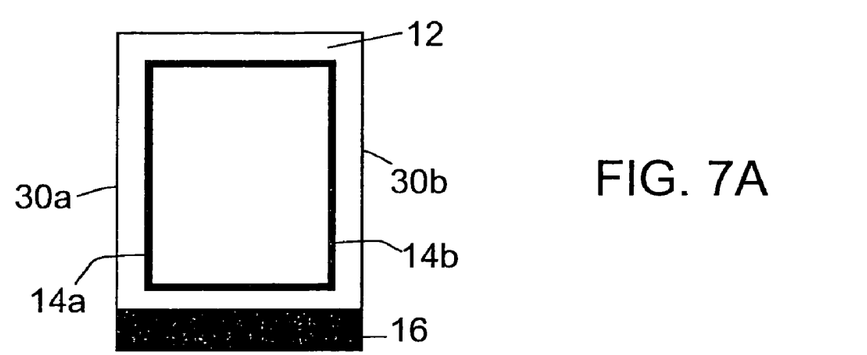
Figure 7B:
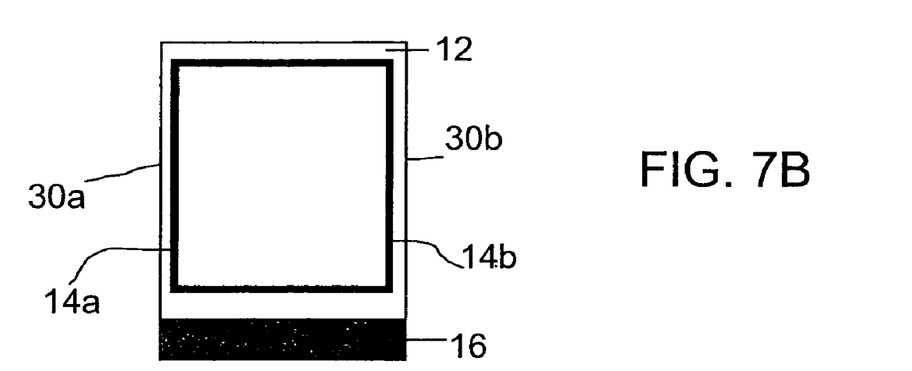
Figure 7C:
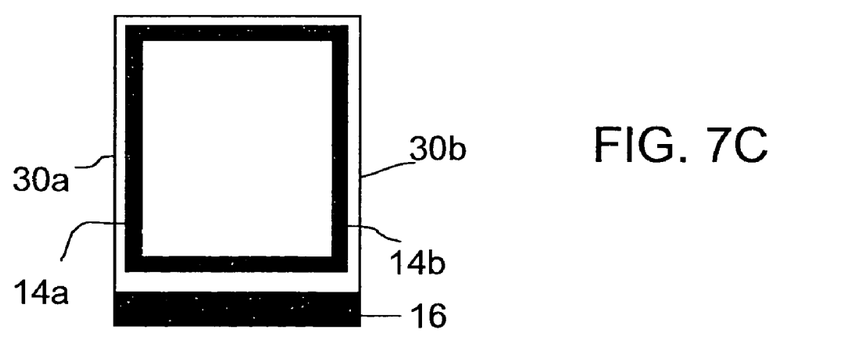

FIG. 7 summarizes representative improvements that can be achieved by certain embodiments of the invention. FIG. 7A shows the conventional package with its large outer unused area; FIG. 7B shows an embodiment of the invention wherein the outer unused area has been substantially reduced and employed to increase the viewing area; and FIG. 7C shows an embodiment of the invention wherein the outer unused area has been substantially reduced and employed to both increase the viewing area (although not to the same extent as in FIG. 7B) and increase the mechanical strength of the package through the use of a wider sintered frit wall. The reductions in unused areas achieved by the invention represent a significant accomplishment in terms of display viewing area and/or mechanical strength of sealed devices. In particular, in the mobile display market, the reduction in package size with an increased viewing area results in a display which consumers consider to be a premium product, a highly desired result for display manufacturers.

A variety of modifications which do not depart from the scope and spirit of the invention will be evident to persons of ordinary skill in the art from the foregoing disclosure. For example, although the invention has been illustrated in terms of display applications it can also be used with other types of electronic components such as components used in lighting applications. The following claims are intended to cover the specific embodiments set forth herein as well as such modifications, variations, and equivalents.

What is claimed is:

1. A package comprising a first glass substrate, a second glass substrate, a wall that comprises a sintered glass frit and separates the first and second substrates, and at least one electronic component that is hermetically sealed between the first and second substrates by the wall, wherein:
   (a) the package has first and second sides:
   (b) the wall has first and second sides which are substantially parallel to the first and second sides of the package, respectively;
   (c) the first side of the package and the first side of the wall are separated by a distance $D_{first}$;
   (d) the second side of the package and the second side of the wall are separated by a distance $D_{second}$; and
   (e) at least one of $D_{first}$ and $D_{second}$ is less than or equal to 200 microns.

2. The package of claim 1 wherein both $D_{first}$ and $D_{second}$ are less than or equal to 200 microns.

3. The package of claim 1 wherein at least one of $D_{first}$ and $D_{second}$ is approximately equal to 100 microns.

4. The package of claim 1 wherein both $D_{first}$ and $D_{second}$ are approximately equal to 100 microns.

5. The package of claim 1 wherein the package has at least one additional side that is separated from the wall by a distance that is less than or equal to 200 microns.

6. The package of claim 1 wherein at least one of the first or second sides is formed by grinding a scored and broken glass edge.

7. The package of claim 6 wherein the grinding is performed while flooding the edge with a cooling medium.

8. The package of claim 6 wherein a space between the first and second glass substrates and the wall is filled with a resin prior to the grinding.

9. The package of claim 1 wherein the electronic component is an organic light emitting diode.

10. A method of making the package of claim 1, comprising the step of grinding a scored and broken glass edge to form at least one of the first or second sides.

11. The method of claim 10, further comprising the step of flooding the edge with a cooling medium while performing the grinding step.

* * * * *